United States Patent [19]
Ito et al.

[11] Patent Number: 5,808,348
[45] Date of Patent: Sep. 15, 1998

[54] NON-UNIFORMLY NITRIDED GATE OXIDE AND METHOD

[75] Inventors: Akira Ito, Palm Bay; John T. Gasner, Satellite Beach, both of Fla.

[73] Assignee: Harris Corporation, Melbourne, Fla.

[21] Appl. No.: 884,032

[22] Filed: Jun. 27, 1997

Related U.S. Application Data

[62] Division of Ser. No. 503,048, Jul. 17, 1995, Pat. No. 5,650,344.

[51] Int. Cl.$^6$ .................................................. H01L 29/76
[52] U.S. Cl. ........................ 257/410; 257/411; 438/287; 438/585
[58] Field of Search .................................. 257/410, 411; 438/287, 585

[56] References Cited

U.S. PATENT DOCUMENTS 4,704,302  11/1987  Bruel et al. ............................. 427/38
5,714,788   2/1998  Ngaoaram ............................... 427/38

Primary Examiner—Sara W. Crane
Assistant Examiner—Douglas A. Wille
Attorney, Agent, or Firm—Rogers & Killeen

[57] ABSTRACT

A semiconductor device which includes a polysilicon gate separated from a semiconductor substrate by a re-oxidized nitrided oxide film in which the concentration of re-oxidized nitride in the film underlying the gate is non-uniform and in which the concentration of nitrogen in the substrate and the re-oxidized nitrided oxide along their interface and underlying the gate is non-uniform.

Methods are disclosed of providing the non-uniform concentrations by incomplete shielding of the oxide by the gate during the nitriding and re-oxidizing process.

12 Claims, 1 Drawing Sheet

NON-UNIFORMLY NITRIDED GATE OXIDE AND METHOD

This is a division of application Ser. No. 08/503,048, filed on Jul. 17, 1995, now U.S. Pat. No. 5,650,344.

BACKGROUND OF THE INVENTION

The present invention relates generally to semiconductor devices and more specifically to such devices which have re-oxidized nitrided oxide regions.

Until recently, various semiconductor devices, such as N and P type MOSFETs which include a polysilicon gate overlying a gate oxide, were formed with gates composed of regular oxide material, i.e. silicon dioxide gates in devices constructed from a silicon substrate. There is a strong trend toward scaling down the size of such devices without compromising performance capabilities.

One practice that has been employed in the manufacture of scaled down devices is the use of re-oxidized nitrided oxide material for gate oxides. It has been shown that the use of re-oxidized nitrided gate oxides (ONO gates) provides a significant improvement in gate oxide quality with respect to charge generation due to high field and radiation, retardation of boron diffusion from boron doped polysilicon gates, and hot electron resistance in both P and N-MOSFETs. Additionally, the high positive fixed charge at the edge of the polysilicon gates, which results from the use of ONO gates, beneficially increases the punch through voltage for P-MOSFETs.

It has been determined that the foregoing benefits do not all flow directly from the ONO gate, but also from the nitrogen region which forms in the substrate and the gate oxide along their mutual interface as the result of forming the ONO gate. The nitrogen region forms in both the substrate and in any overlying nitrided oxide material along the interface of the substrate and the overlying nitrided oxide, which may include all or part of the gate oxide. In prior art devices this nitrogen region is uniform along the interface of the gate oxide and the substrate, and typically has a nitrogen concentration level of upwards of 10–20% by atomic weight.

There are some disadvantages, however, associated with the ONO gates of the prior art and the accompanying underlying nitrogen regions. For example, the uniform ONO gates of the prior art result in a uniform high fixed charge density along the interface of the gate oxide and the substrate (i.e. over the entire width of the gate oxide). The high fixed charge density under the interior or center of the ONO gate increases scattering and thus detrimentally degrades mobility between the gate oxide and the substrate.

It has now been determined that nitrogen concentration levels of greater than about 4% will cause mobility to be unacceptably reduced. It has further been determined the nitrogen concentration levels of about 4% or somewhat less under the gate oxide provide adequate hot electron resistance and retardation of boron penetration from a polysilicon gate into the substrate. It is also known that a nitrogen concentration level of about 10% or greater is required under the periphery of the gate oxide to provide a high enough positive fixed charge density to sufficiently increase the punch-through voltage for P-MOSFETs.

Therefore, an improved and preferred device with an ONO gate may be formed such that the nitrogen region has a nitrogen concentration level of no more than about 4% under the center of the gate oxide and a nitrogen concentration level of at least about 10% at and beyond the periphery of the gate oxide. Other improved, but less preferred devices may be formed simply by providing a nitrogen region with a comparatively reduced level of nitrogen under the gate oxide, or in some instances by providing a nitrogen region which only partially extends under the gate oxide from the periphery towards the center thereof.

The aforementioned improved semiconductor devices having ONO gates may be formed by nitriding the gate oxide after the formation of a polysilicon gate above the gate oxide. The presence of the polysilicon gate may provide partial or near total shielding of the gate oxide underlying the polysilicon gate during the nitriding step (and also during the re-oxidizing step). The shielding during nitriding may reduce the concentration of re-oxidized nitrided material over the width of the gate oxide and particularly at the center thereof. Likewise, the shielding reduces the concentration of nitrogen in the nitrogen region underlying the gate oxide in direct proportion to the reduced concentration of re-oxidized nitrided material overlying the nitrogen region. Furthermore, the shielding may protect the gate oxide from being contaminated by unwanted particles during the nitriding and re-oxidizing steps.

Accordingly, it is an object of the present invention to provide a novel method of nitriding a gate oxide in a semiconductor device.

It is another object of the present invention to provide a novel method of selectively forming a nitrogen region with a non-uniform concentration of nitrogen in a semiconductor device.

It is yet another object of the present invention to provide a novel method of selectively forming a nitrogen region in a semiconductor device with a non-uniform concentration of nitrogen over the width of a gate oxide and having a minimum level of nitrogen under the center thereof.

It is still another object of the present invention to provide a novel method of forming a polysilicon gate above a gate oxide prior to re-oxidizing and nitriding the gate oxide.

It is a further object of the present invention to provide a novel method of protecting a gate oxide from contamination during nitriding and re-oxidizing processes.

It is yet a further object of the present invention to provide a novel device having a nitrogen region with a non-uniform concentration of nitrogen under a gate oxide.

It is still yet a further object of the present invention to provide a novel device having a non-uniformly nitrided and re-oxidized gate oxide.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1A:
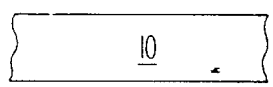
FIG. 1A is an elevation in cross-section of a semiconductor device substrate.

A method of carrying out the present invention is illustrated by FIGS. 1A–1F, which are elevational cross-section views of a semiconductor device at various stages of the method. In preparation for the Selectively re-Oxidized Nitrided gate Oxide (SONO) process, a silicon semiconductor substrate 10, having a thickness suitable for the formation of N and/or P type MOSFET's for example, may be provided as shown in FIG. 1A.

Figure 1B:
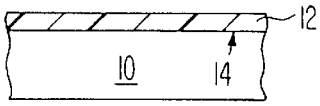
FIG. 1B is an elevation in cross-section of the semiconductor device of FIG. 1A after the addition of an oxide film.
Figure 1C:
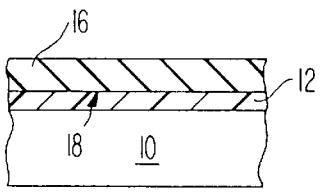
FIG. 1C is an elevation in cross-section of the semiconductor device of FIG. 1B after the addition of a polysilicon layer.

With reference to FIG. 1B, an oxide film 12 may be grown in a dry oxygen ambient on an upper surface 14 of the substrate 10. Thereafter a polysilicon layer 16, between 150 and 600 nanometers thick, may be deposited on the upper surface 18 of the oxide film 12 and doped, as shown in FIG. 1C. Selective areas of the polysilicon layer 16 are masked using a photo process, and the exposed areas etched (e.g., Reactive Ion Etching) to form a polysilicon gate 20 on the oxide film 12, shown in FIG. 1D. The polysilicon gate 20 defines a gate oxide 21 as the portion of the oxide film 12 under the polysilicon gate 20.

Figure 1D:
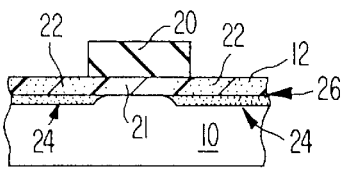
FIG. 1D is an elevation in cross-section of the semiconductor device of FIG. 1C after the formation of a polysilicon gate.

The SONO process of the method is initiated by nitriding the oxide film of the semiconductor device shown in FIG. 1D. Nitriding may be conducted in an ammonia ($NH_3$) ambient having a temperature of 900° to 1200° C. for between 1 and 180 seconds. The polysilicon gate 20 shields the underlying gate oxide 21 with respect to the nitriding ambient. Accordingly the gate oxide 21 is nitrided over the width of the gate oxide 21 to a lesser and lesser extent as the center of the gate oxide is approached.

The SONO process is completed by re-oxidizing the nitrided oxide film in a dry oxygen ambient having a temperature of 900° to 1200° C. for between 10 and 180 seconds to form the re-oxidized nitrided region 22 (shown as the shaded region). As in the nitriding step, the polysilicon gate 20 shields the gate oxide with respect to the re-oxidizing ambient, causing the gate oxide to be re-oxidized to a lesser extent as the center of the gate oxide is approached.

Carrying out the SONO process after the formation of the polysilicon gate 20 on the oxide film 12 enables the formation of a gate oxide which is comprised of a decreasing concentration of re-oxidized nitrided oxide as the center of the gate oxide is approached from the periphery thereof (i.e., the concentration of re-oxidized nitrided oxide is non-uniform over the width of the gate oxide). The actual concentration of re-oxidized nitrided oxide in the gate oxide may range from zero to greater than about 120%.

Variation in the temperatures of the nitriding and re-oxidizing ambients, as well as variation in the time of exposure to the ambients, and channel length all may affect the concentration of re-oxidized nitrided oxide in various portions of the gate oxide 21. Higher temperatures and longer exposure times produce a gate oxide 21 in which the concentration of re-oxidized nitrided oxide is higher and/or in which a greater percentage of the gate oxide 21 is comprised of re-oxidized nitrided oxide. For example, in FIG. 1D the gate oxide 21 is re-oxidized and nitrided only in the shaded region 22. If higher ambient temperatures and/or longer ambient exposure times were used in the SONO process, the re-oxidized nitrided region 22 would tend to extend further towards the center of the gate oxide 21, and in some instances extend all the way through the gate oxide so that the gate oxide is fully made up of re-oxidized nitrided oxide.

With continued reference to FIG. 1D, the SONO process also results in the formation of a nitrogen region 24 in the substrate 10 and the oxide film 12 along the interface 26 of the oxide film 12 and the substrate 10. The formation of the nitrogen region 24 is related to the formation of the re-oxidized nitrided region 22, and consequently the extension of the nitrogen region 24 along the interface 26 corresponds substantially with the extension of the re-oxidized nitrided region 22 in the oxide film 12. Preferably the nitrogen region 24 has a nitrogen concentration between about 0.1% and 20.0% by atomic weight at the interface 26. The nitrogen concentration may vary within the region 24 along the interface 26 and typically tapers off in proportion with the tapering off of the concentration of re-oxidized nitrided oxide towards the center of the gate oxide 21.

Figure 2A:
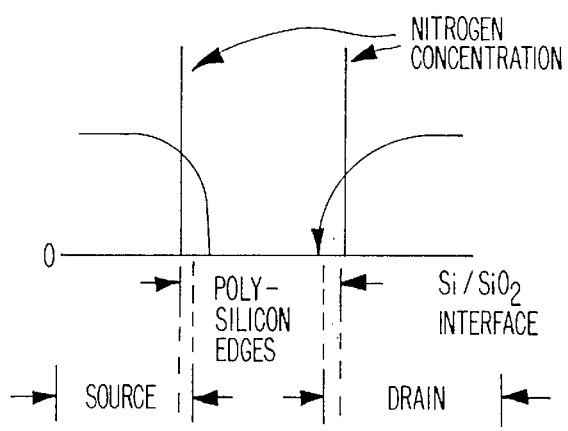
FIG. 2A is a graph of nitrogen concentration verses position along the substrate/oxide film interface for the semiconductor device of FIG. 1F.

FIG. 2A is a graph of nitrogen concentration verses position along the interface 26 for the device depicted in FIG. 1D. As is evident from FIG. 2A, the nitrogen concentration falls off sharply to zero under the periphery of the gate oxide 21.

Figure 1E:
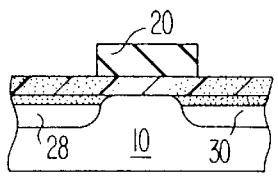
FIG. 1E is an elevation in cross-section of the semiconductor device of FIG. 1D after the formation of source and drain regions.

After completion of the SONO process, N and P-channel source and drain regions, 28 and 30, shown in FIG. 1E, may be formed by any conventional process. For example, the source and drain regions may be formed by phosphorus N-lightly doped drain (LDD) and boron P-LDD implants, respectively.

A spacer oxide may then be deposited for forming heavily doped N and P-channel source and drain regions by P+ boron implant and N+ implant (which also may be used to dope the polysilicon gate instead of $POCl_3$). Thereafter the source and drain junctions may be annealed using rapid thermal processing (RTP) equipment or a diffusion furnace. Alternatively the SONO process may be used to anneal the source and drain functions.

Figure 1F:
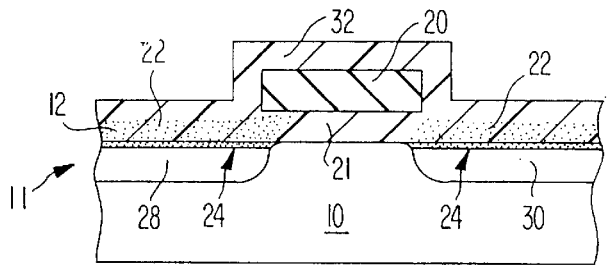
FIG. 1F is an elevation in cross-section of the semiconductor device of FIG. 1E after the addition of a second oxide film.

Finally, a second oxide film 32 is formed over the upper surface of the oxide film 12 and the polysilicon gate 20 to form the semiconductor device 11, shown in FIG. 1F, which may be a P-MOSFET, N-MOSFET or some other device.

Figure 2B:
FIG. 2B is a graph of nitrogen concentration verses position along the substrate/oxide film interface for the semiconductor device of FIG. 3.
Figure 3:
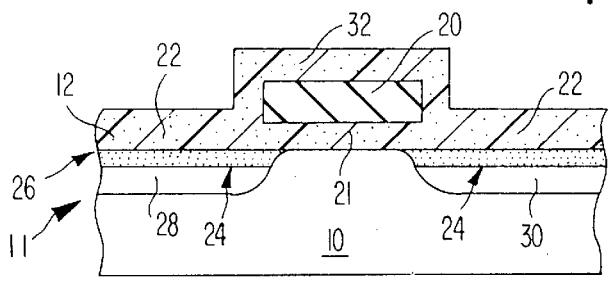
FIG. 3 is an elevation in cross-section of a semiconductor device formed in accordance with an alternative embodiment of the invention.

In a preferred embodiment of the invention, the resulting device 11 has a cross-section similar to that shown in FIG. 3. With continued reference to FIG. 3, the entire gate oxide 21 is comprised of re-oxidized nitrided oxide, and the nitrogen region 24 extends along the interface 26 under the entire gate oxide 21. In this preferred embodiment the nitrogen region 24 has a concentration that is no greater than about 4% by atomic weight under the center of the gate oxide 21 and at least about 10% or greater by atomic weight above the source and drain regions, 28 and 30. FIG. 2B is a graph of nitrogen concentration verses position on the interface 26 for the device depicted in FIG. 3.

One advantage of nitrogen regions having at least about 10% nitrogen above the source and drain regions is that they bring about a high fixed charge density between the oxide film 12 and the substrate 10 at the periphery of the gate oxide 21. The high fixed charge density at the periphery increases the punch through voltage for P-MOSFETs, and increases the hot electron resistance for both P and N-MOSFETS, both of which are desirable characteristics in such semiconductor devices.

Conversely, high fixed charge density is avoided under the center of the gate oxide 21 as a result of there being a lower concentration of nitrogen under the center of the gate oxide 21. Accordingly, it is preferable for the nitrogen concentration to be non-uniform along the interface 26 under the gate oxide, varying between about 10% under the periphery of the gate oxide and less than about 4% under the center of the gate oxide. The absence of high fixed charge density under the gate oxide 21 advantageously permits mobility between the gate oxide 21 and the portion of the substrate 10 underlying the gate oxide. If nitrogen concentration was higher than about 4% under the center of the gate oxide 21, mobility could be undesirably degraded between the gate oxide 21 and the substrate 10.

High fixed charge density under the gate oxide 21 could potentially be avoided in prior art SONO processes by increasing the re-oxidation time and temperature (as fixed charge density decreases with increasing re-oxidation times and temperatures). Higher re-oxidation time and temperature however, may adversely affect the silicon wafers by causing crystalline defects (slips) in the wafers. Accordingly, the available prior art technique for controlling high fixed charge density unacceptably exposes the silicon wafers from which the devices are constructed to risk of damage.

Another advantage associated with the preferred embodiment of the method is that the nitrogen region underlying the gate oxide 21 retards the diffusion of boron from the boron doped polysilicon gate 20 into the silicon substrate 10 underlying the gate oxide 21. It has been determined that the higher the concentration of nitrogen, the smaller the boron penetration into the substrate. The benefits of the nitrogen region 24 as a boron diffusion barrier is particularly evident in short channel devices, which typically have a higher concentration of nitrogen (at least 4%) under the center of the gate oxide 21 than do longer channel devices.

A further advantage of all the present methods is that the gate oxide is protected from being contaminated with unwanted particles during the SONO process as a result of the formation of the polysilicon gate over the gate oxide before carrying out the SONO process.

As is evident from the foregoing, the above advantages may be obtained because the polysilicon gate 20 is formed before the SONO process is carried out. Forming the polysilicon gate before carrying out SONO facilitates the formation of the re-oxidized nitrided region 22 and the nitrogen region 24 which taper off with approach to the center of the gate oxide 21. The tapering off of these regions results in a novel semiconductor device 11 having the advantageous characteristics discussed above.

In alternative embodiments of the novel method, the SONO process may be carried out after the formation of N and P-channel source and drain regions in the device, and/or after the formation of the second oxide film over the upper surface of the oxide film and the polysilicon gate. Both of these alternative embodiments result in the formation of re-oxidized nitrided gate oxides and nitrogen regions which taper off with approach to the center of the gate oxide.

In other alternative embodiments of the novel method, the oxide film may be formed in a wet ambient which may or may not include hydrogenchloride (HCl) or trichloroethane (TCA). Still further alternative embodiments may utilize an $N_2O$ ambient for nitriding the oxide film instead of $NH_3$.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A field-effect semiconductor device comprising:

a semiconductor substrate of a first conductivity type;

source and drain regions of a second conductivity type formed in said substrate;

a channel region in said substrate defined as a portion of the substrate between said source and drain regions;

a non-uniformly re-oxidized nitrided oxide film formed on the upper surface of said substrate;

a polysilicon gate formed on said oxide film overlying the channel region, said gate defining the portion of said re-oxidized nitrided oxide film underlying said gate as a gate oxide; and a nitrogen region formed in said substrate and oxide film, the concentration of nitrogen in said nitrogen region being less under the center of the gate oxide than above said source and said drain regions.

2. The semiconductor device of claim 1 wherein the concentration of nitrogen in the nitrogen region is no greater than about 20.0% by atomic weight and is at a minimum under the center of the gate oxide.

3. The semiconductor device of claim 1 further comprising a second oxide film overlying the polysilicon gate and the oxide film to thereby increase the thickness of the oxide film without increasing the thickness of the gate oxide.

4. In a field-effect semiconductor device having an oxide film formed on a semiconductor substrate and a gate oxide defined in the oxide film, the improvement comprising a nitrogen region in the substrate having a concentration of nitrogen which is at a minimum under the gate oxide.

5. In a semiconductor device having a gate separated from a semiconductor substrate by a nitrided gate oxide, the improvement wherein the concentration of nitrided oxide in said nitrided gate oxide is non-uniform.

6. The device of claim 5 wherein said concentration is less in the center of said nitrided gate oxide than at the periphery thereof.

7. The device of claim 6 wherein said concentration is between about 0.1% and 4% in the center of said nitrided gate oxide.

8. The device of claim 6 wherein said concentration is between about 10% and 20% at the periphery of said nitrided gate oxide.

9. In a semiconductor device having a gate separated from a semiconductor substrate by a nitrided gate oxide and a region of nitrogen in said substrate adjacent to said nitrided gate oxide, the improvement wherein the concentration of nitrogen in said region is non-uniform.

10. The device of claim 9 wherein said concentration is less under the center of said nitrided gate oxide than under the periphery thereof.

11. The device of claim 9 wherein said concentration is between about 0.1% and 4% under the center of said nitrided gate oxide.

12. The device of claim 9 wherein said concentration is between about 10% and 20% under the periphery of said nitrided gate oxide.

* * * * *